United States Patent
Solgaard et al.

(10) Patent No.: US 6,713,367 B2
(45) Date of Patent: Mar. 30, 2004

(54) SELF-ALIGNED VERTICAL COMBDRIVE ACTUATOR AND METHOD OF FABRICATION

(75) Inventors: Olav Solgaard, Palo Alto, CA (US); Uma Krishnamoorthy, Union City, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 10/229,578

(22) Filed: Aug. 27, 2002

(65) Prior Publication Data

US 2003/0073261 A1 Apr. 17, 2003

Related U.S. Application Data

(60) Provisional application No. 60/315,552, filed on Aug. 28, 2001.

(51) Int. Cl.[7] .......................... H01L 21/30; H01L 21/46; H01L 21/302; H02N 1/00; H01H 57/00
(52) U.S. Cl. ..................... 438/459; 438/738; 438/50; 310/309; 200/181; 200/600
(58) Field of Search .............................. 438/50–53, 455, 438/459, 7; 73/514.01, 514.32; 310/309; 200/181, 600; 385/16

(56) References Cited

U.S. PATENT DOCUMENTS

| 5,025,346 A | 6/1991 | Tang et al. |
| 6,133,670 A | 10/2000 | Rodgers et al. |
| 6,229,640 B1 | 5/2001 | Zhang |
| 6,386,716 B2 | 5/2002 | Hagelin et al. |
| 6,524,878 B2 * | 2/2003 | Abe et al. ...................... 438/52 |
| 2003/0019832 A1 * | 1/2003 | Conant et al. .................. 216/2 |

OTHER PUBLICATIONS

Krishnamoorthy, U., et al., "Self–aligned vertical combdrive actuators for optical scanning micromirrors", date unknown, 2 pages.

Nee, Jocelyn t., et al., "Lightweight,Optically Flat Micromirrors for Fast Beam Steering", *IEEE/LEOS Optical MEMS 2000 Conference*, Aug. 21–24, 2000, Kauai, Hawaii, 2 pages.

* cited by examiner

*Primary Examiner*—John F. Niebling
*Assistant Examiner*—Viktor Simkovic
(74) *Attorney, Agent, or Firm*—Dorsey & Whitney LLP

(57) ABSTRACT

A method of fabricating a self-aligned vertical combdrive is described. The method includes the steps of etching in a semiconductor wafer a first comb with a coarse set of teeth. A second semiconductor wafer is bonded to the first set of teeth. A set of accurately positioned teeth is etched in the second wafer with teeth overlapping the teeth in the first comb. The lower teeth are etched using the overlapping teeth as a mask to assure proper alignment. One variation in this fabrication method whereby the first coarse comb teeth are etched on semiconductor-on-insulator instead, allows creation of double-sided comb actuators with increased torsional deflection range. Another variation to this fabrication method that keeps the electrically isolated upper masking teeth allows creation of dual-mode vertical comb actuators after an initial assembly step.

7 Claims, 5 Drawing Sheets

SELF-ALIGNED VERTICAL COMBDRIVE ACTUATOR AND METHOD OF FABRICATION

RELATED APPLICATIONS

This application claims priority to provisional application Ser. No. 60/315,552 filed Aug. 28, 2001.

GOVERNMENT SUPPORT

This invention was made with Government support awarded by the Defense Advanced Research Projects Agency. The Government has certain rights in this invention.

BRIEF DESCRIPTION OF THE INVENTION

This invention relates generally to vertical combdrive actuators and to a method of fabrication, and more particularly to a method of fabrication, which provides narrow gap high force combdrive actuators. This invention also describes a double-sided torsional vertical combdrive actuator for increased torsional deflection and a related fabrication method. Finally, this invention presents a fabrication method variation for design of dual-mode vertical combdrive actuators.

BACKGROUND OF THE INVENTION

There is great demand for high-speed, high-resolution micromirrors in a variety of optical applications including optical scanning, optical switching, free-space optical communications, optical phased arrays, optical filters, external cavity lasers, adaptive optics and other applications. For many of these applications, electrostatic combdrives are the preferred actuation mechanism. Combdrives provide high speed and relatively high force. Furthermore, they can be fabricated using standard materials.

Combdrives produce large deflections at relatively low voltages with continuous stable control over the full range of motion. In vertical combdrives, two sets of comb teeth are staggered in the vertical direction. A voltage applied between the movable top comb array and the static bottom comb array produces a vertical electrostatic force that can be applied to create torsional or piston-like motion. In standard horizontal combdrives the two sets of comb teeth are in-plane (in the horizontal direction) and the piston-like motion is also in-plane in the horizontal direction.

A critical aspect of combdrive design is the spacing or gap between adjacent comb teeth, because the generated force is inversely proportional to this gap. Combdrives with small spacing are, however, more susceptible to misalignment between the interleaved comb teeth. For proper actuator operation, the misalignment tolerance level between the moveable and stationary teeth should be an order of magnitude smaller than the gap width. Micromachined vertical combdrives have been demonstrated in the past. However, the fabrication processes for these devices are either quite complex or create comb teeth that are not accurately aligned.

OBJECTS AND SUMMARY OF THE INVENTION

It is a general object of the present invention to provide a method of fabrication for vertical combdrives with small gaps or spacings between adjacent comb teeth, thereby providing high speed and high force actuation.

It is a further object of the present invention to provide a fabrication process that provides self-aligned vertical combdrives.

It is another object of this invention to provide a double-sided torsional vertical combdrive actuator that increases the range of torsional motion, and a method of fabrication for this device.

Another object of this invention is to present a modified fabrication process and a simple assembly technique to create vertical combdrives for independently controlled torsional and piston motion (dual-mode actuation).

The foregoing and other objects of the invention are achieved by a method of fabrication in which both the top and bottom comb teeth of the vertical combdrive actuator are defined by a single fabrication mask with accurately spaced gaps. This pattern is first transferred to the top comb layer to form the top comb teeth and a mask for the bottom comb teeth. This mask for the bottom comb teeth is then used to fabricate bottom comb teeth that are aligned automatically to the top comb teeth.

BRIEF DESCRIPTION OF THE DRAWINGS

The invention will be more clearly understood from the following description when read in connection with the accompanying drawings in which.

DETAILED DESCRIPTION OF PREFERRED EMBODIMENTS

Figure 1A:
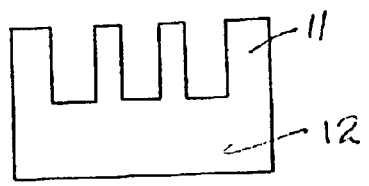
FIGS. 1A–1E show process flow steps in the fabrication of a self-aligned vertical combdrive actuator.
Figure 1B:
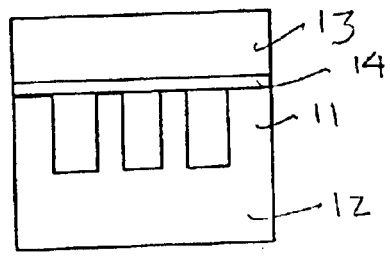
Figure 1C:
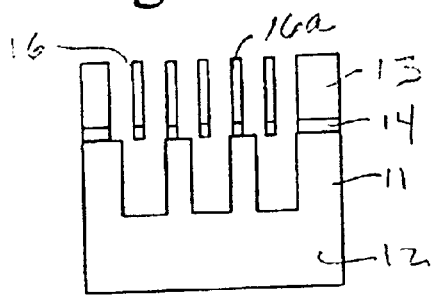
Figure 1D:
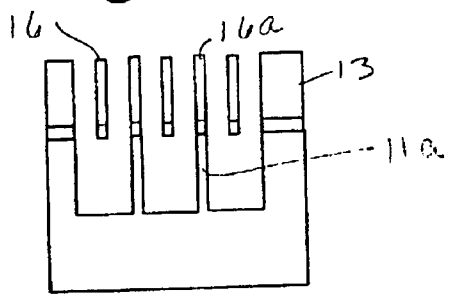
Figure 1E:
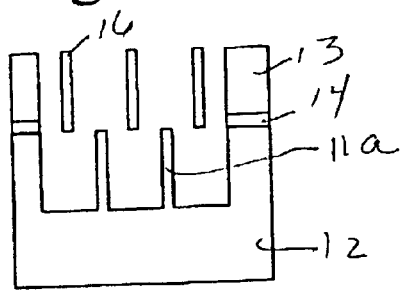

The steps in the fabrication of a combdrive actuator in accordance with one embodiment of the present invention are described with reference to FIGS. 1A–1E. The self-aligned comb actuators are fabricated in semiconductor crystalline material preferably single crystal silicon using deep reactive ion etching (DRIE). The first step, FIG. 1A, is to create a coarse set of bottom comb teeth 11 in silicon wafer 12. The teeth are fabricated by masking and then deep reactive ion etching for a predetermined time. Both silicon wafers 11 and 13 are oxidized to form oxide layer 14. The wafer 13 is then bonded, for example by fusion bonding, to the top of the bottom comb teeth 11. The silicon wafer 13 is then ground and polished to define the thickness of the top comb layer, FIG. 1B. The next step is to lithographically define both the upper and lower combs on the silicon wafer 13. DRIE etching is used to etch through the top silicon layer 13 to pattern the comb teeth for both the upper and lower comb which, in accordance with the present embodiment, will create the movable top comb teeth 16 and a silicon mask for the bottom comb teeth 16a, FIG. 1C. The only alignment requirement is that, when formed, the upper or movable teeth overlap the coarse bottom comb teeth 11. The alignment tolerances are in the order of the tooth spacing. The oxide layer 13 is then anisotropically or isotropically etched to expose the silicon of the coarse bottom teeth. This is followed by a DRIE etch of the exposed portion of the bottom teeth to define the final bottom comb teeth 11a, which are automatically aligned with the upper comb teeth 16a, FIG. 1D. In one method of fabrication, the masking silicon teeth of the top layer are removed, FIG. 1E, to provide an upper comb whose teeth are interleaved and accurately aligned with the teeth of the bottom comb and moveable with respect thereto. In a variation of this process, the masking teeth 16a are not removed, but are disconnected from the movable teeth 16 so that the movable teeth are free to move with respect to the static or fixed bottom and upper teeth 11a and 16a.

Figure 2:
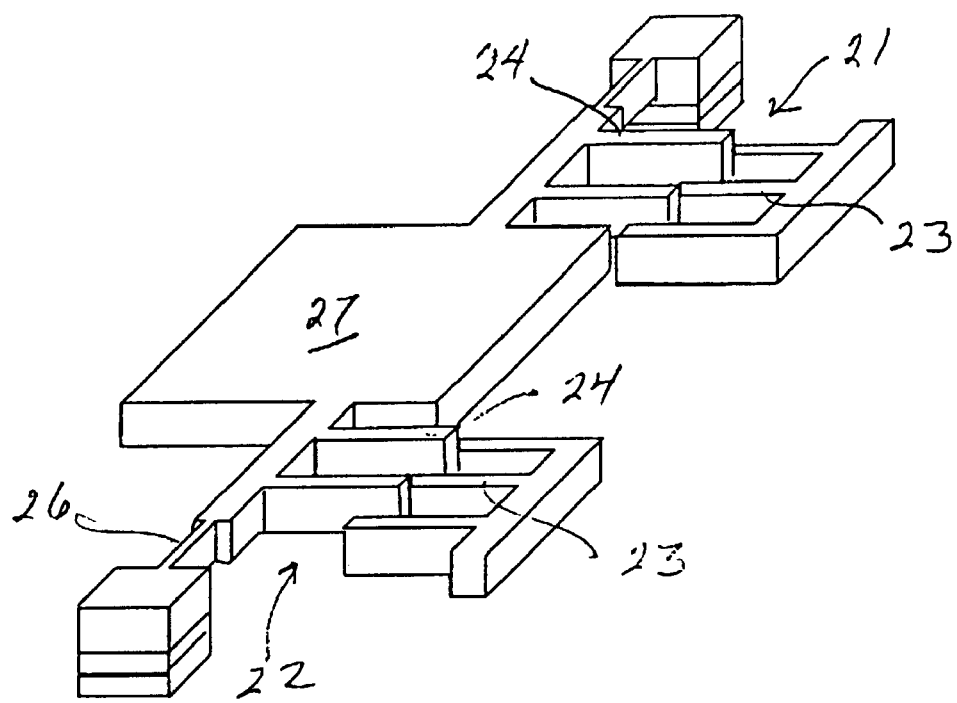
FIG. 2 illustrates a self-aligned combdrive actuator driving a hinged mirror.
Figure 3:
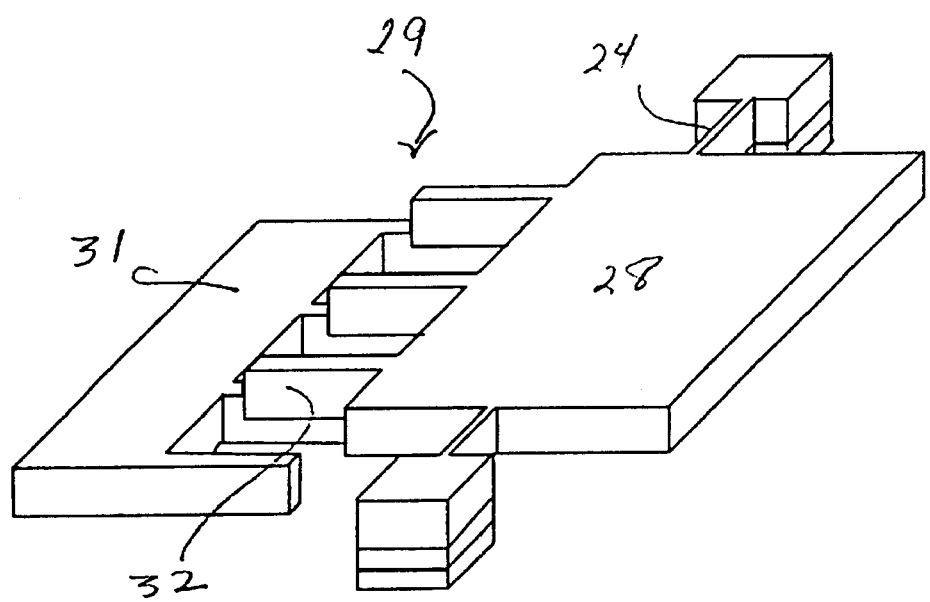
FIG. 3 illustrates another self-aligned combdrive actuator driving a hinged mirror.

FIG. 2 shows a pair of actuators 21 and 22 having fixed or static teeth 23 and interleaved movable teeth 24, staggered in the vertical direction, driving the torsional hinges 26 of mirror 27. FIG. 3 shows a hinged mirror 28 driven by a combdrive actuator 29 having fixed combs 31 and movable combs 32 staggered in the vertical direction and connected to drive the mirror 28. Actuation of the actuators of FIGS. 2 and 3 is accomplished by applying a voltage between the fixed and movable teeth. This voltage generates a torsional force about the torsional hinges 24 resulting in the rotation of the actuator and mirror in the corresponding direction. Although self-aligned vertical combdrives have been used in connection with mirrors in optical switching and scanning applications, it is to be understood that the combdrives can be used as actuators in many applications, such as micromirrors for optical switching, optical scanning for displays, barcode scanners, optical communications, optical coherence tomography, optical filters, external laser cavity lasers, adaptive optics, phase arrays, maskless lithography, confocal microscopy, displays, printers, spectroscopes, gyroscopes, resonators, micro-relay, sensors, accelerometers and for other micromanipulation or microtranslation.

The steps in fabricating a vertical combdrive actuator in accordance with another embodiment of the invention are set forth in FIGS. 4A–4E. These actuators are ideal for isolating comb electrodes in the bottom layer. The first step in forming the bottom stationary comb for the combdrive actuator is to select a silicon-on-insulator (SOI) wafer 36 having a lower silicon substrate layer 37, an oxide layer 38 and a device silicon layer 39, FIG. 4A. The wafer is then masked and DRIE-etched to form the coarse bottom comb teeth 41. A silicon wafer 42 is then oxidized with an oxide layer 43 and fusion bonded to the bottom comb teeth. Alternatively, both the silicon wafer 42 and the bottom SOI wafer 36 can be oxidized prior to fusion bonding. The wafer is then polished to define the thickness of the top layer, FIG. 4B. The next step is to lithographically defined both the upper and lower combs on the wafer 42. DRIE etching is used to etch through the top silicon layer 42 to pattern the comb teeth for both the upper and lower comb which, in accordance with the present embodiment, will create the movable top comb teeth 44 and a silicon mask 44a for the bottom comb teeth 41, FIG. 4C. The only alignment requirement is that, when formed, the upper or movable teeth overlap the coarse bottom teeth 41. The alignment tolerances are in the order of the tooth spacing. The oxide layer 38 is then anisotropically or isotropically etched to expose the silicon of the coarse bottom teeth. This is followed by a DRIE etch of the exposed portion of the bottom teeth to define the final bottom comb teeth 41a, which are automatically aligned with the upper comb teeth 44, FIG. 4D. In one method of fabrication, the masking silicon teeth of the top layer are removed, FIG. 4E, to provide an upper comb whose teeth are interleaved and accurately aligned with the teeth of the bottom comb and moveable with respect thereto.

Figure 4A:
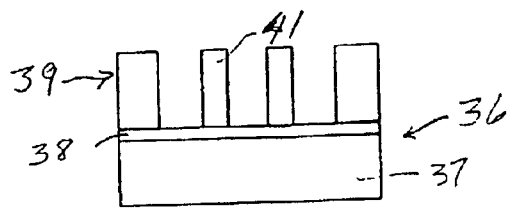
FIGS. 4A–4E show the process flow steps of another method of fabrication of a self-aligned combdrive actuator for double-sided operation.
Figure 4B:
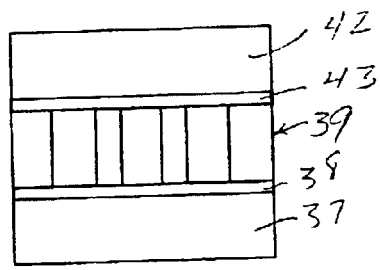
Figure 4C:
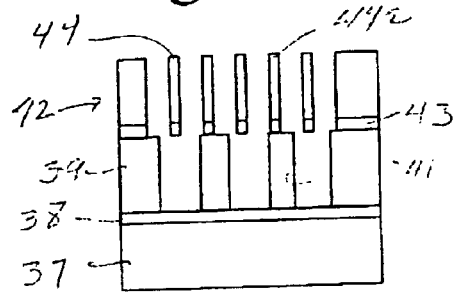
Figure 4D:
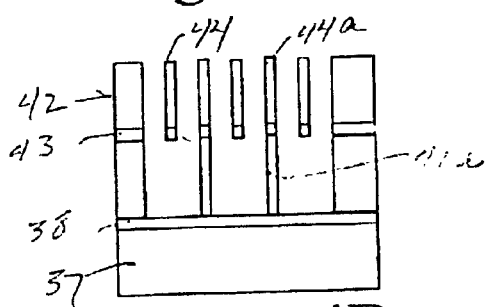
Figure 4E:
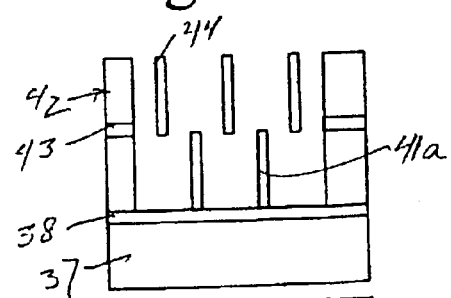
Figure 5:
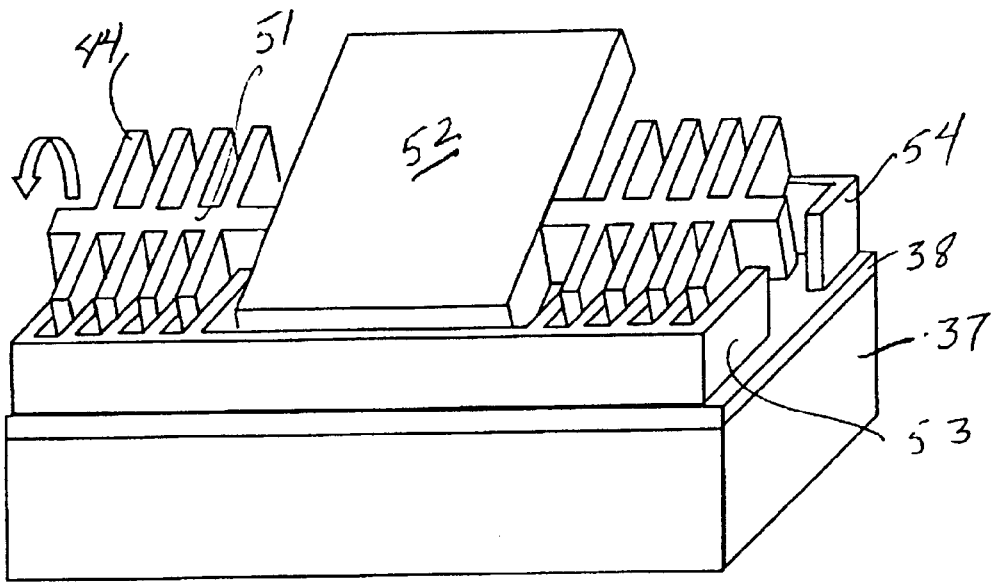
FIG. 5 shows a mirror driven by a double-sided vertical combdrive actuator fabricated as shown in FIGS. 4A–4E.

The process illustrated in FIGS. 4A–4E facilitates isolation of bottom electrodes or teeth allowing fabrication of double-sided vertical combdriven actuators as shown in FIG. 5. The actuator of FIG. 5 includes upper or moveable comb teeth 44 extending outwardly from a drive member 51. The drive member is shown connected to a mirror 52 with its ends suitably supported (not shown) so that it can be rotated. Since the stationary or bottom comb teeth are supported on oxide layer 38, two isolated sets 53 and 54 can be supported on the substrate 37 with opposite voltages applied to move the comb teeth 44 in opposite directions. This doubles the range of torsional deflection of the actuator, since the actuator can be rotated clockwise with one bottom electrode and counterclockwise with the second bottom electrode. Such devices can also be operated as linear actuators.

Figures 7A, 7B:
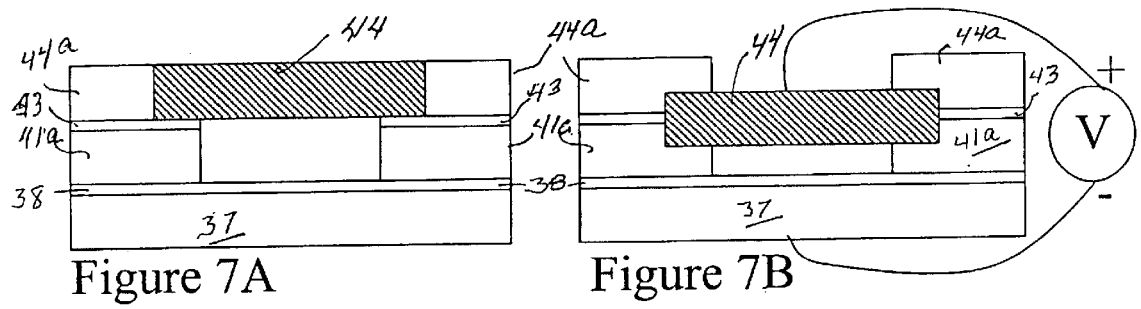
FIGS. 7A–7B show a combdrive cross-section of the self-aligned dual-mode actuator fabricated as shown in FIGS. 6A–6D.
Figure 8:
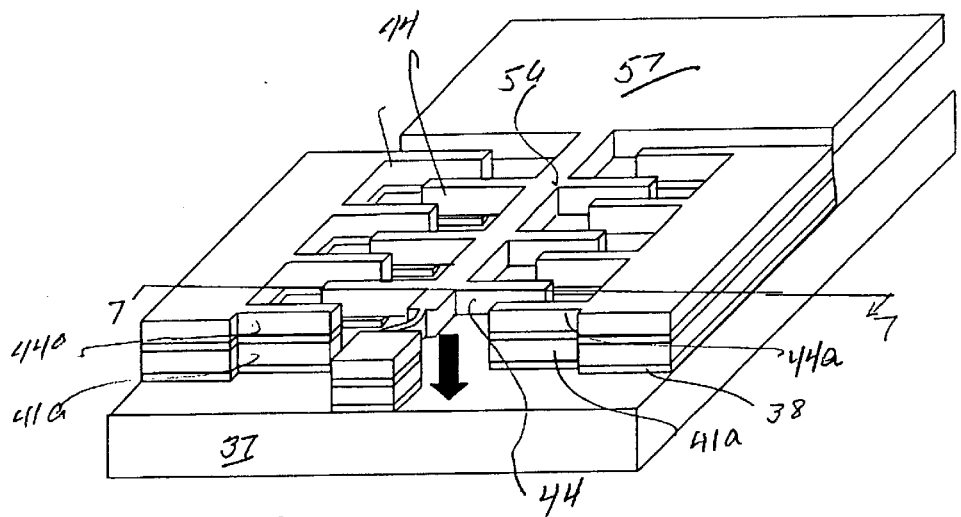
FIG. 8 illustrates a dual-mode self-aligned vertical combdrive actuated mirror.

A variation to this process is shown in FIGS. 6A–6D. This process is identical to the one illustrated in FIGS. 4A–4E and includes the same reference numerals for like parts. However, it does not include the last step illustrated in FIG. 4E. Here, the masking silicon 44a in FIG. 4E is not removed, but is electrically isolated from the other electrodes. This configuration creates a set of static top comb teeth 44a in addition to the movable top comb teeth 44 and the static bottom comb teeth 41. FIG. 8 shows a dual-mode actuator which can be fabricated using appropriate masking to define the teeth in the upper wafer 42 which serve as a mask for the fixed teeth. The actuator includes a set of movable teeth 44 connected to member 56 shown connected to drive mirror 57. It is apparent that the member could be used to drive other appliances. Stationary comb drive teeth 41a, 44a are supported on the oxide layer 38 on substrate 37. FIG. 7A shows a cross-section taken along line 7—7 of FIG. 8 showing the static and movable comb teeth 41a, 44a and teeth 44. As shown in FIG. 7B, applying a bias voltage either between the movable top comb and the silicon substrate 37 or between the movable comb and the static bottom comb teeth 41a pulls the movable comb downward (FIG. 8). Positioning the movable comb between the top static and bottom static comb electrodes enables individual control of the torsional and piston-like motion of the device creating a dual-mode actuator.

Figure 6A:
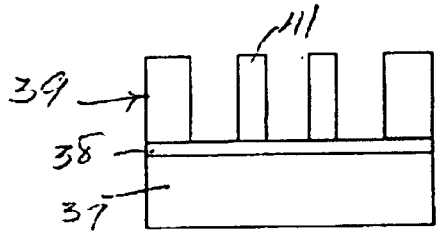
FIGS. 6A–6D show the modified process flow for fabricating self-aligned dual-mode vertical combdrive actuators.
Figure 6C:
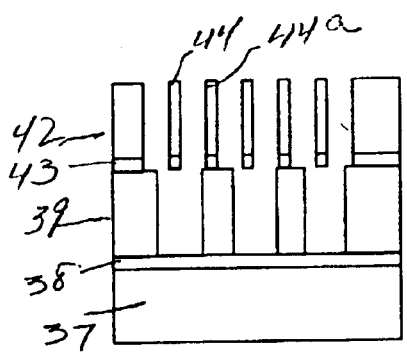
Figure 6B:
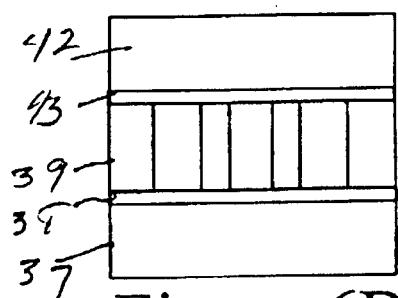
Figure 6D:
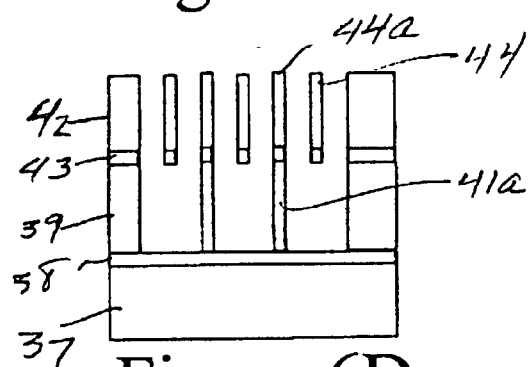
Figure 9A:
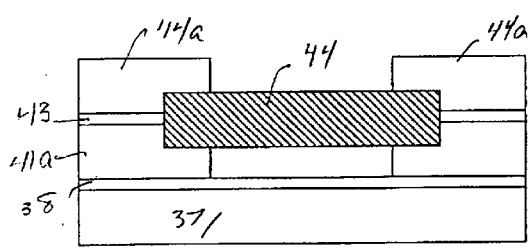
FIGS. 9A–9B illustrate linear or piston-like operation of the self-aligned dual-mode combdrive of FIG. 8.
Figure 9B:
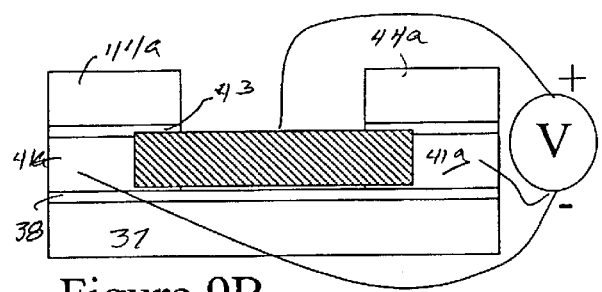

Operation of this dual-mode vertical comb actuator having the structure of FIG. 6D is illustrated in FIGS. 9–10. FIGS. 9A, 9B illustrate operation of the dual-mode actuator as a piston. Voltages are applied between moveable teeth or electrodes 44 and both lower fixed teeth or electrodes 41a for downward motion. Similarly, voltages are applied between the moveable teeth 44 and both sets of upper fixed teeth 44a for upward motion.

Figure 10A:
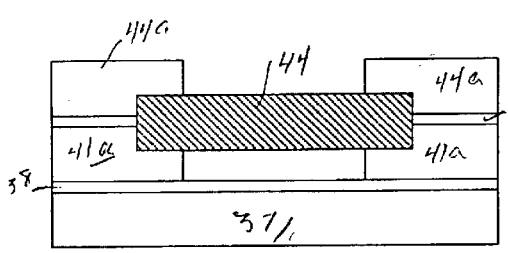
FIGS. 10A–10B illustrate torsional operation of the self-aligned dual-mode combdrive of FIG. 8.
Figure 10B:
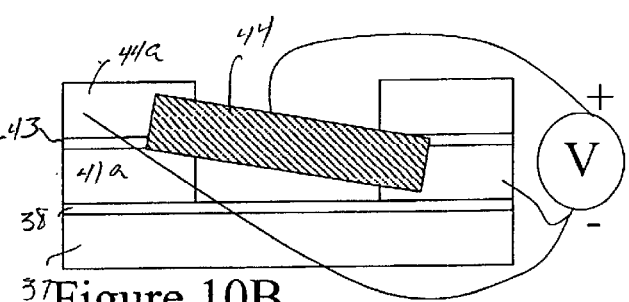

FIGS. 10A–10B show operation of actuator for rotational or torsional motion. Voltages are applied between electrode or teeth 44 and diagonal electrodes 41a and 44a for clockwise rotation and counter-clockwise rotation. The mirror 57, FIG. 8, can be rotated applying appropriate voltages between electrodes or teeth 44 and between diagonal electrodes or teeth 41a and 44a. Thus, by the application of appropriate voltages to the movable and fixed electrodes or teeth, the mirror can be moved up and down or rotated.

The foregoing descriptions of specific embodiments of the present invention are presented for the purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of fabricating a self-aligned combdrive actuator comprising the steps of:

etching, in a wafer of semiconductive material, spaced electrode teeth extending upwardly from a base to form a fixed comb, oxidizing at least one surface of a second wafer of semiconductive material, fusing the oxidized surface of said second wafer to the upper surface of said fixed comb teeth, masking and etching accurately spaced electrode teeth through said second wafer to form a movable comb with tooth spacing such that alternate teeth overlap the fixed comb teeth, and etching the fixed comb teeth using the overlapping teeth as a mask to thereby provide accurately aligned upper and lower teeth.

2. A method of fabricating a self-aligned combdrive actuator as in claim 1 which includes the additional step of removing the overlapping teeth from the movable comb to permit movement of the movable comb with respect to the fixed comb.

3. A method of fabricating a self-aligned combdrive as in claim 1 which includes the additional step of detaching the overlapping teeth from the movable comb to permit movement of the movable comb with respect to the fixed comb.

4. A method of fabricating a self-aligned combdrive which comprises the steps of:

selecting a wafer of semiconductive material having a base layer and an upper layer separated by an oxide layer, etching the upper layer down to the oxide layer to form spaced electrode teeth extending upwardly from said oxide layer to form at least one fixed comb isolated from the base layer, selecting a second wafer of semiconductive material and oxidizing at least one surface of said second wafer, fusing the oxidized surface of said second wafer to the upper surface of said fixed comb teeth, masking and etching accurately spaced electrode teeth through said second wafer to form a movable comb with tooth spacing such that alternate teeth overlap the fixed comb teeth, and etching the fixed comb teeth using the overlapping teeth as a mask to thereby provide accurately aligned upper and lower teeth.

5. A method of fabricating a self-aligned combdrive actuator as in claim 4 which includes the additional step of removing the overlapping teeth from the movable comb to permit movement of the movable comb with respect to the fixed comb.

6. A method of fabricating a self-aligned combdrive as in claim 4 which includes the additional step of detaching the overlapping teeth from the movable comb to permit movement of the movable comb with respect to the fixed comb.

7. A method of fabricating a combdrive actuator as in claim 6 in which said fixed comb wafer is etched to form first and second spaced fixed combs isolated from one another and in which said second wafer is etched to form a movable comb with teeth that interleave with each of said first and second spaced comb teeth.

* * * * *